United States Patent [19]
Toyama et al.

[11] 4,354,108
[45] Oct. 12, 1982

[54] ATOMIC BEAM DEVICE

[75] Inventors: Jiro Toyama, Akashi; Hiromi Takaoka, Kobe; Kyoji Kariya, Kakogawa, all of Japan

[73] Assignee: Fujitsu Limited, Japan

[21] Appl. No.: 112,632

[22] PCT Filed: Nov. 2, 1978

[86] PCT No.: PCT/JP78/00018
§ 371 Date: Jul. 8, 1979
§ 102(e) Date: Jun. 25, 1979

[87] PCT Pub. No.: WO79/00281
PCT Pub. Date: May 31, 1979

[30] Foreign Application Priority Data
Nov. 8, 1977 [JP] Japan .............................. 52-1343390

[51] Int. Cl.³ ............................................... H01S 1/00
[52] U.S. Cl. ................................................. 250/251
[58] Field of Search ...................... 250/251; 331/3, 94

[56] References Cited
U.S. PATENT DOCUMENTS

| | | | |
|---|---|---|---|
| 3,323,008 | 5/1967 | Holloway et al. | 250/251 |
| 3,348,040 | 10/1967 | Vessot | 250/251 |
| 3,397,310 | 8/1968 | Holloway et al. | 250/251 |
| 3,967,115 | 6/1976 | Kern | 250/251 |

Primary Examiner—Bruce C. Anderson
Attorney, Agent, or Firm—Staas & Halsey

[57] ABSTRACT

A cesium beam tube for use as a frequency standard, wherein the beam path from the cesium beam source unit to the detector is hermetically sealed.

This cesium beam tube includes a rigid high frequency transition part composed of a metallic block which is used as the basic support of the tube. A first state selection magnet part and the cesium beam generator are coaxially coupled to the one end of the rigid cavity, while the second state selection magnet part and detector are coaxially connected to the other end of the rigid cavity. The rigid cavity, first and second magnet poles, cesium beam generator and the detector form the vacuum envelope by themselves, and the permanent magnets and other related parts are not in a vacuum.

6 Claims, 7 Drawing Figures

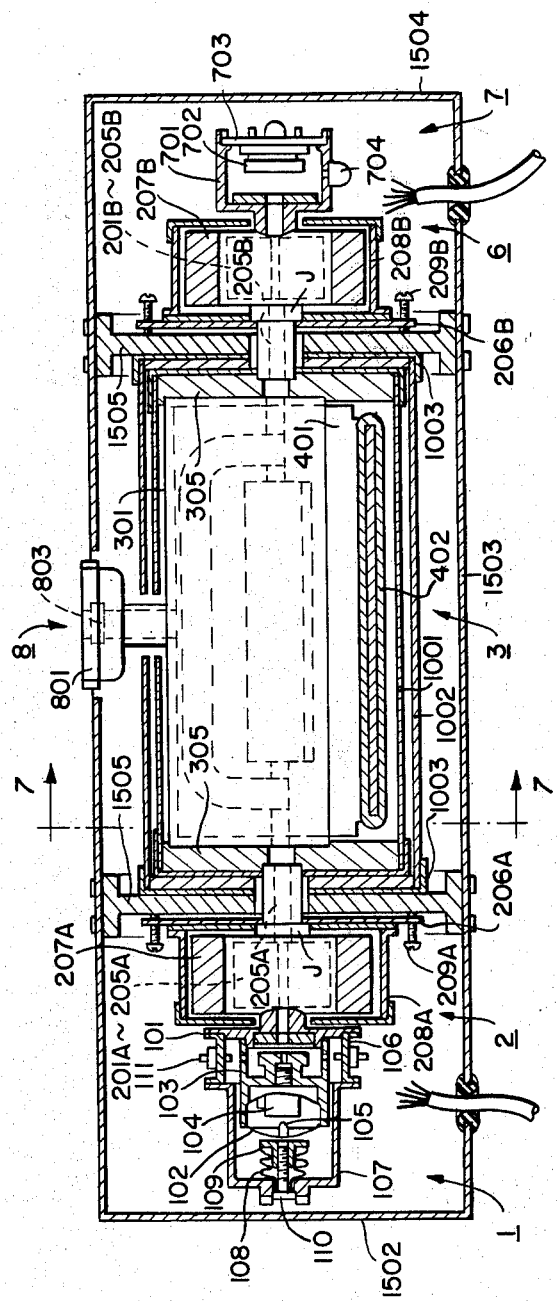
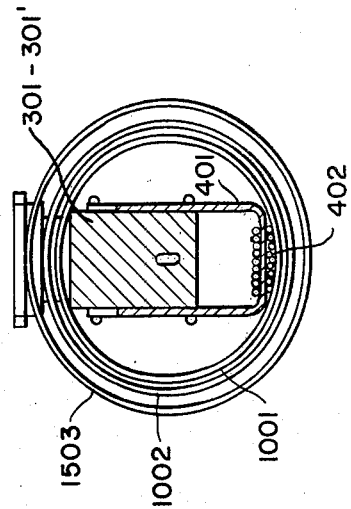
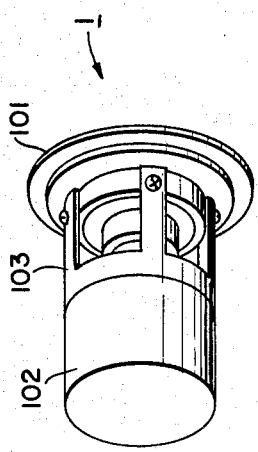

ATOMIC BEAM DEVICE

BACKGROUND OF THE INVENTION

This invention relates to an atomic beam device for frequency standards using an atomic or molecular beam, and in more detail, to a newly designed compact, rigid and inexpensive cesium beam tube which is easy to maintain.

An atomic beam tube which utilizes the atom spectrum of cesium (Cs) for a frequency standard generally includes the basic structure as shown in FIG. 1.

In FIG. 1, the cesium oven 1 which is used as the cesium beam source heats the cesium Cs to a temperature of 80° to 100° C. so that it is vaporized and thereby generates the Cs beam through the collimator.

This Cs beam enters the detector 7 through the first state selection magnet 2 for producing a magnetic field A, high frequency transition part 3, including the microwave cavity 5 placed in the field, for producing a magnetic field C, and the second state selection magnet 6 for producing a magnetic field B. On the other hand, a microwave signal is supplied to an RF input circuit 8. When the frequency of this microwave signal coincides with the transition frequency of the Cs atoms, resonance of the Cs atoms occurs in the cavity 5, resulting in the maximum output of the detector 7. Therefore, a highly stabilized oscillation frequency can be obtained by using closed loop control for the oscillation frequency of the microwave oscillator, for example, such as a crystal controlled oscillator, so that the microwave signal frequency is maintained at the center of the resonance spectrum of the Cs atom. The transition frequency of the Cs atom in the ground state is 9192.631770 MHz.

An example of the conventional cesium beam tube which is configured by combining the above-mentioned basic elements is shown in the Japanese patent publication No. Toku-Ko-Sho 42-27517 (corresponding U.S. Pat. No. 3,323,008). Moreover, an example of another conventional cesium beam tube is also disclosed in the Japanese patent laid-open application No. Toku-Kai-Sho 51-64895 (corresponding U.S. Pat. No. 3,967,115). The structure of the cesium beam tube in accordance with these prior art references is shown in FIG. 2 in the form of a cross-section.

In FIG. 2, the atomic beam generator 1, A magnetic field unit 2, high frequency transition part 3, B magnetic field unit 6, detector 7, C magnetic field unit 4 and magnetic shield 10 are rigidly and levelly mounted on the mount 9 as shown in FIG. 2. Each element is arranged on the mount 9 so that the atomic beam generated from the atomic beam generator 1 reaches the detector through the specified route G. The mount 9, which is holding each element mentioned above, is provided at the inside of the case 11 which ensures a hermetically sealed structure in combination with the cover 13. The high frequency input circuit 8 is engaged with the case 11 and projected to the outside, and moreover is held to the mount 9 at the section D thereby resulting in a sufficient seal. In addition, at the above-mentioned high frequency signal input port 8, which is coupled to the microwave signal to be supplied from the external circuit, a sealing material 14 is provided, through which said microwave signal effectively passes. In order to hermetically seal each element accommodated in the case 11, the cover 13 is mounted to the case 11 and the area around the joint, namely the part E, is sealed by a means such as welding. In the above-mentioned structure of the atomic beam device, an air exhaust system and vacuum ion pump are connected to an air exhaust port which is provided on case 11 but which is not illustrated in FIG. 2, so that the inside of the atomic beam device is maintained in a vacuum condition. In this case, the ion pump may be built inside of the device or provided as an additional unit outside of the device. After the air in the atomic beam device is exhausted until a vacuum is obtained, the air exhaust system is removed. Then, by sealing said air exhaust port, the atomic beam device can be completed. The part 12 is an airtight electrical connection terminal engaged with the case 11, and is connected to the related portions of the atomic beam device.

However, the existing atomic beam device having the structure mentioned above has always been accompanied by the following problems because the required elements are all housed in the vacuum envelope. The magnets which form the magnetic fields A and B are permanent magnets which are generally manufactured by a method such as casting or sintering. Therefore, such magnets have many fine vacant spaces, which are filled with various kinds of gas. Since it is difficult to sufficiently exhaust gas when sealing the atomic beam device in the vacuum condition, the gas may gradually be released to the inside of the atomic beam device after it is completed. If such gas is released in the atomic beam device, the vacuum is deteriorated, and moreover the Cs source or other portions may be contaminated. Furthermore, the excitation coil used for producing magnetic field C and other internal wiring with an insulation coating also absorbed various kinds of gas, causing the disadvantages mentioned above.

When exhausting the air from the atomic beam device, it is necessary to exhaust the air while the tube is heated to a specified baking temperature in order to exhaust the above-mentioned absorbed gas. This baking temperature is usually 300° C. or higher, which deteriorates or demagnetizes the permanent magnets provided for the magnetic fields A and B. Moreover, the excitation coil for the magnetic field C and the insulation for covering other wires must be heat-resistant. In addition, since the highly permeable magnetic material used as the yoke for said magnetic field C may, for example, be mechanically held together by means of small screws, stress may be generated inside of the yoke material due to differences in the thermal expansion coefficients during said baking, thereby sometimes generating distortion. Such distortion, if it occurs, will result in a non-uniform magnetic field C applied to the atomic beam path of the high frequency transition part. For this reason, it was difficult to exhaust the air from the atomic beam device while maintaining an adequate baking temperature.

Moreover, the air should be exhausted by sustaining the atomic beam device at the baking temperature for a considerable period of time. On the other hand, as described previously, the gas released gradually from the magnets, coil, wiring and other materials even after the air is exhausted deteriorates the vacuum or contaminates the environment, so it was also necessary to sustain the vacuum by additionally providing an ion pump. Said ion pump is positioned outside the atomic beam device or built inside of said device. The former method increases the outside dimensions, while the latter method inevitably results in a complicated device because of the magnet of the ion pump. Furthermore, regardless of how the ion pump is installed, a high voltage power supply is required in order to operate said ion pump, complicating the structure of the device. An extra power supply and facilities are required for operating the atomic beam device, raising the cost as a whole.

Since each component of the existing atomic beam device is supported on the standard level F of the mount 9, which is spaced far from the atomic beam path G, minute displacements such as twisting or inclination between respective elements influence the atomic beam path G to an undesirably large extent. In order to prevent this disadvantage, it is necessary for mount 9 to be strong enough for maintaining mechanical flatness, so that the material used must have rigidity and sufficient strength. However, particularly if the device is shipped on vehicles, ships or airplanes, a specially designed buffer unit must be added, thereby increasing weight and size, so that the device will survive external forces such as vibration, impact and inertia etc.

SUMMARY OF THE INVENTION

It is a main object of the present invention to offer a new version of the atomic beam device which solves the disadvantages in the existing atomic beam device, particularly a cesium beam tube.

It is another object of the present invention to offer an improved atomic beam device having compact design, light weight, and rigid structure.

Moreover, another object of the present invention is to offer an atomic beam device which has a coaxial supporting structure with excellent mechanical strength, and which can be assembled easily with little error in the parts arrangement.

It is a further object of the present invention to offer an improved atomic beam device which eliminates the necessity of a vacuum ion pump and which allows little deterioration in the vacuum.

In summary, the present invention is characterized, in an atomic beam device having an atomic beam generator, a first state selection magnet part, a high frequency transition part, a second state selection magnet part and a detector, by hermetically coupling each element mentioned above on the common axis of the beam path.

In addition, according to other characteristics of the present invention, said high frequency transition part is composed of a metal block forming a microwave cavity, and the structure using this metal block as the basic supporting body of the atomic beam device is given. At one end of the metal block, which forms a rigid cavity, the first state selection magnet portion and the Cs chamber for generating the atomic beam are coaxially coupled in the sealed condition, while at the other end of the metallic block, the second state selection magnet portion and the detector are coaxially coupled also in the sealed condition. The permanent magnets for the magnetic fields A and B and the coil for the magnetic field C are provided outside of the vacuum beam path.

BRIEF DESCRIPTION OF DRAWINGS

FIG. 3 shows a cross section of an embodiment of the cesium beam device related to the present invention;

FIG. 6 is an outline of the cesium beam oven; and

FIG. 7 shows a cross section along the line 7—7 of FIG. 3 of the structure for establishing the magnetic field C.

DESCRIPTION OF THE PREFERRED EMBODIMENTS

A preferred embodiment of a cesium beam device according to the present invention will be explained hereunder by referring to FIG. 3.

Figure 1:
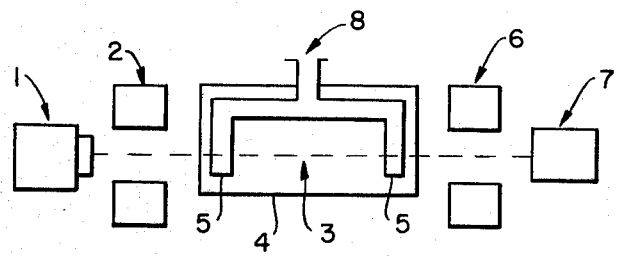
FIG. 1 shows a principle structure of an atomic beam device.
Figure 2:
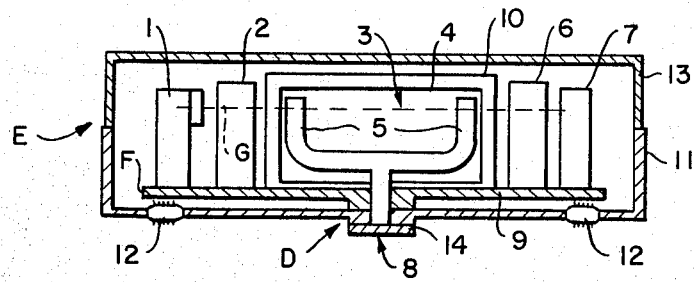
FIG. 2 shows a cross section of the existing cesium beam device structure.
Figure 4:
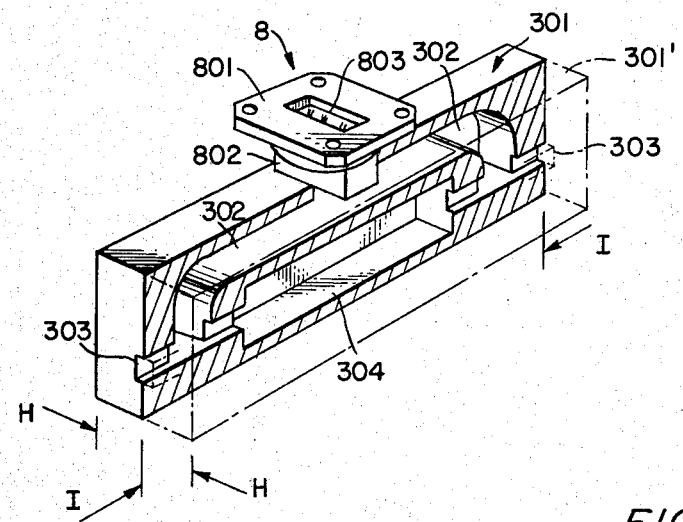
FIG. 4 shows a perspective view of the metal block of the high frequency transition part providing a microwave cavity.

In FIG. 3, the high frequency transition part 3 includes a metal block 301 formed of two block portions 301' as shown in FIG. 4. Said metal block is manufactured from, for example, oxygen-free copper. Namely, a half of the branching waveguide 302 and the inlet and outlet ports 303 for the atomic beam are formed in each of the two portions 301', the adjoining surfaces of which are parallel to the atomic beam patch in FIG. 4. The chamber 304 is formed simultaneously by cutting or pressing between the inlet and outlet ports 303. Getter for absorbing Cs or other gases through a coating of graphite, for example, may be deposited on the internal wall of chamber 304. Further, in case it is necessary to measure the magnetic field, it is also possible to include a Zeeman coil in chamber 304. One portion 301' of block 301 is combined with the other portion 301' (illustrated by the dot-dash line in FIG. 4), which is machined quite symmetrically and hermetically sealed by soldering at the joint where mutual waveguides are positioned face to face. At the high frequency input port 8, the coupling flange 801 and high frequency waveguide 802 are hermetically sealed at the specified position by soldering so that they are integrated into said block. At the high frequency input port 8, the sealing window 803, which is made of dielectric material, is welded in order to sustain the waveguide 302 in the sealed condition. Said window is generally well known. The surfaces H—H of block 301, which are parallel to the atomic beam path, are used as the standard level for fixing the yoke for establishing the magnetic field C at a constant space as will be described later. Both ends I—I, which are perpendicular to the atomic beam path, are respectively used for soldering the flanges 305 and moreover become the standard surfaces for placing the magnetic units for fields A and B, the Cs atom beam generator 1, and detector 7 at the proper locations. The flanges 305, which may be mounted by soldering, have central hollowed areas which are respectively engaged with the surfaces I of the block 301, while at the opposite sides are hollowed areas which engage the magnetic units, including the yokes for non-uniform magnetic fields for the magnetic fields A and B. Each flange 305 has a central hole which is required in order to form the path of the atomic beam.

Figure 5:
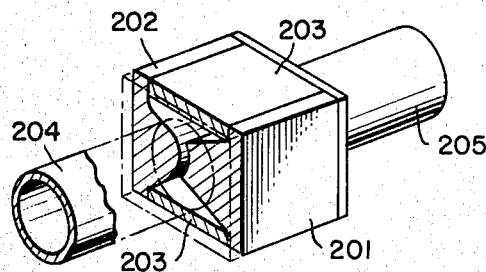
FIG. 5 shows a perspective view of the magnetic unit structures used for the magnetic fields A and B.

The magnetic units which form the poles for the magnetic fields A and B are symmetrically arranged at both sides of the high frequency transition part 3 using structures such as shown in the perspective view of FIG. 5. It is noted that the suffixes "A" and "B" in FIG. 3 identify elements associated with fields A and B, respectively. At the atomic beam path, the poles 201 and 202 are arranged face to face in order to form a non-uniform magnetic field and the spacers 203 are arranged at both sides in order to maintain the space between said poles. The spacers 203 are made of a non-magnetic material. The metallic cylinders 204 and 205 extend from the ends of the magnetic units and are mounted in the hermetically sealed condition. Said poles 201 and 202, spacers 203, and cylinders 204 and 205 are assembled at both ends of the metal block 301 in the positions illustrated and then sealed at every joint by soldering.

The metal cylinders 205 of both magnetic units are made of oxygen-free copper allowing plastic deformation to facilitate adjustment of the beam axis, as will be described later, and sealed by soldering after being engaged with the outer hollowed areas of the flanges 305. Here, before the above-mentioned soldering, the flanges 206A and 206B are welded to the collars J provided at the outside of cylinders 205A and 205B as shown in FIG. 3. The end of cylinder 204 of the magnetic field unit for magnetic field A is sealed to the atom beam generator 1. Moreover, the end of cylinder 204 of the magnetic field unit for field B is sealed to the detector 7.

FIG. 6 shows a perspective view of the atomic beam generator 1. The flange 101 is integrated to the cylinder 204 of said magnetic field A unit. Chamber 102, which has a diaphragm and a needle for breaking a sealed vessel containing cesium, is mechanically coupled to flange 101 by means of a metal support 103 made of the material which allows little propagation of heat. Moreover, metal support 103 is configured to minimize heat propagation. That is, heat propagation is reduced by cutting away portions to leave a plurality of feet attached to flange 101.

The structure and functions of the atom beam generator 1 will be explained in more detail by referring again to FIG. 3. In FIG. 3, inside of the chamber 102, is a sealed vessel 104 containing cesium. A needle 105 for unsealing the vessel is also provided inside of the diaphragm opposite said sealed vessel.

Flange 101 is connected to case 107 of the unsealing mechanism for the vessel 104 by means of the spacer ring 106. The unsealing means for said vessel comprises the bellows 108, which can be extended inwardly from the end of case 107, and the end boss 109, which is internally screwed and mounted at the end of said bellows 108. Said spacer ring 106, case 107, and bellows 108 and boss 109 are respectively sealed by soldering at the contact areas. Tightly engaged screw 110 extends from a hole at the center of the end of case 107 to boss 109. When the screw 110 is rotated into case 107, the bellows 108 extend up to the diaphragm surface of chamber 102. When the screw is rotated further, the boss 109 comes to contact with the diaphragm surface of the chamber 102 and finally pushes the diaphragm of the chamber 102, moving needle 105 against vessel 104 to open it. Thereafter, when the screw 110 is rotated in the opposite direction, the boss 109 is withdrawn to the end of the case 107 and the bellows 108 is compressed, thereby returning to the initial condition. In this case, the diaphragm and needle of the chamber 102 are also restored to the initial condition and thus the contact with the Cs vessel is broken. Thereby heat propagation to the Cs vessel from the outside is interrupted. Cesium escapes from the broken hole of the Cs sealing vessel, and is vaporized by the Cs vapor generator 1. Thus the chamber 102 is gradually filled with such vapor and then the Cs atom beam is expelled into the magnetic field A from a collimeter in the beam generator vessel 1 at a speed determined in accordance with the temperature. The Cs atom beam generator 1 includes other parts not illustrated, such as a heater which maintains the cesium at the desired temperature and pressure, a temperature measuring thermistor which maintains and controls the temperature at a constant value, and getter which absorbs unwanted gas and maintains the vacuum condition. An electrical terminal 111 for these parts is provided at the spacer ring 106 and extends to the outside.

The cylinder 204 of a magnetic field unit as shown in FIG. 5 is connected to the detector vessel 701 which houses the detector 7, as shown in FIG. 3. The detector 702 is positioned within vessel 701 to receive the atomic beam. Said detector 702 is assembled on a ceramic stem 703 sealing the end of vessel 701, which also houses parts not illustrated such as a hot wire ionizer, collector, and getter. The terminal pins of these parts are extended through the stem 703.

For the purpose of exhausting the air from the atomic beam device to achieve a vacuum, the exhaust tube 704 is provided at the side of detector vessel 701 and it is chipped off after completion of air exhaustion. The location of the exhaust tube 704 is not restricted to the detector, and it can be positioned elsewhere, for example, at the metal block of the high frequency transition part.

The above detailed explanation is related mainly to the structure for maintaining the vacuum condition of the atomic beam path, including the Cs atom beam generator, the magnetic pole structure for the magnetic field A, the high frequency transition block, the magnetic pole structure for the magnetic field B, the detector, and the envelope of the beam path connecting said parts. Suitable material for the vacuum envelope, that is materials which are stable at high vacuum and temperature and which are highly reliable, can be easily selected. Other parts or members, such as permanent magnets, coils, and the yoke for magnetic field C, which are influenced by a high temperature or which may release gas after air exhaustion, are not included in the vacuum envelope. Therefore when exhausting the envelope to the vacuum condition after assembly, it can be maintained at the baking temperature for a sufficient period of time. The soldering and welding sequence outlined above for connecting each part can, of course, be modified to facilitate assembly. It is recommended that the alignment of the beam path after assembling the elements arranged to the right of the Cs vessel 104, be visually established by firing the hot wire ionizer in detector 702. After alignment, the vessel 104 and the elements to the left of it are assembled as shown in FIG. 3. The method for connection is not limited to soldering and adequate methods may be employed, for example, electron beam welding and soldering in a hydrogen atmosphere.

The external accessories shown in FIG. 3 are added to the main body of the Cs atomic beam device produced as discussed above. At the side surfaces H—H of the block portions 301' of the high frequency transition part 3, the yoke 401, which is made of the material having high permeability, is mounted as shown in FIG. 7 corresponding to the cross section 7—7 of FIG. 3. At the lower area of said yoke 401, the coil 402 is wound for the magnetic field C. At the circumference of the flanges 305 provided at the respective end surfaces I—I of the block 301, the magnetic shields 1001 and 1002 for protecting the magnetic field C are concentrically mounted.

The magnetic shields 1001 and 1002 are spaced by the spacing elements 1003 and then fixed to the flanges 305 by means of screws (not illustrated). Moreover, at the ends of said shield 1002, frames 1505 are held via the flanges 305, and the casings 1502, 1503 and 1504 are mounted on frames 1505. Elements 1003 and frames 1505, which are composed of separate elements, are mounted in combination from the radial direction. For the magnetic poles 201 and 202 of the magnetic units for fields A and B, the permanent magnets 207A and 207B are mounted from the outside. Magnetic shields 208A and 208B supported on flanges 206A and 206B, respectively, are provided for magnetically protecting said magnetic fields A and B. The magnetic shields 208A and 208B are also composed of different segments and are combined for mounting from the radial direction. Since the cylinders 205A and 205B which support the magnetic units for fields A and B must also support the weight of the Cs atom beam generator 1 and detector 7, the outsides of the flanges 206A and 206B are reinforced in such a way that the circumferences of said flanges are fixed to the sides of said frames 1505 by using plural screws 209. Employment of such configuration is very convenient because when said screws 209 are selectively adjusted around the flanges 206 and the spaces between the flanges 206 and frames 1505 are changed, the inclination of the Cs atom beam in the magnetic fields can be adjusted. The atomic beam device is completed when the casings 1502, 1503, and 1504 are mounted to the frames 1505. The casings 1502 and 1504 are provided with the holes for the cables used for connecting the atomic beam device.

As is explained above in detail, it is one of the characteristics of atomic beam device of the present invention that the elements of the vacuum envelope are directly related to the path of the atom beam. Therefore, the vacuum envelope can be configured by using materials or parts which are very stable in heat and vacuum. In addition, since the magnets, the coil for magnetic field C, and wiring are not provided within the vacuum envelope, problems resulting from the fact that they are exposed to a high temperature during machining and air exhaustion do not occur. For this reason, air exhaustion is fast, and little gas is released thereafter, which ensures a sustained vacuum for a long period of time. Furthermore, complicated structure and treatment for preventing demagnetization of the permanent magnets due to the baking temperature ture are not required. Since a sufficient vacuum is maintained for a sufficient period of time for the ordinary operation of the atomic beam device, a vacuum ion pump is not required in practice. However, if more reliability is necessary, it is of course possible to add the ion pump.

It is another notable characteristic of the present invention that the high frequency transition part is a rigid unit made from the metal block and this unit is used as the basic supporting body for the other parts. Thereby, the device has a coaxial structure with the atom beam path considered as the axis, does not require the standard mounting, ensures very high rigidity, and receives little deformation due to thermal distortion and external mechanical force. In addition, since the device is made with reference to the atom beam path, adjustments for determining the beam path after assembly can be drastically simplified. Particularly, when the atom beam generator 1 is mounted last, the arrangement of the beam path at each element can be adjusted easily and visual from the side of magnetic field A, with the ionizer of the detector being activated. Moreover, since the coil for magnetic field C can be mounted outside the vacuum, ordinary wires can be used and a coil having the desired performance can be designed easily. If desired, the coil can be easily adjusted. Since the yoke for the magnetic field C is mounted and fixed to the side of said rigid metal block, there is no distance variation between the poles. Therefore, a uniform magnetic field can be provided for the entire transition part.

The shield case and yoke have a structure that generate little stress due to thermal deformation and even if a residual magnetization occurs during mounting, it can be erased by applying an AC field from the outside. Since the permanent magnets for magnetic fields A and B are provided outside the vacuum envelope, magnets small in size and light in weight and having excellent performance can be used. Adjustment of the magnetic fields can be performed easily by observing the operating condition of the atomic beam device and by measuring its performance, and thereby the device of the present invention shows excellent performance when used as an atomic, molecular, or other particle beam device.

The above explanation is provided for easy understanding of an embodiment of the present invention, and this invention covers other various applications and modifications.

For example, the metal block forming the high frequency transition part can be formed from two or more blocks. In addition, for example, when the high frequency sealing window position is not limited only to the area before the branching point but is provided near to the transition part after the branching part, the vacuum part of the microwave waveguide, and the block part thereof can be reduced. Additionally the shield case, etc., can be mounted effectively without division into several portions. Moreover, other various kinds of modifications can be considered.

We claim:

1. An atomic beam device of the type including a first state selection magnet part; a high frequency transition part; and a second state selection magnet part sequentially arranged along an atomic beam path in a vacuum envelope extending from an atomic beam generator to a detector, wherein the improvement comprises: said high frequency transition part comprises a rigid metal block forming a portion of the vacuum envelope, and said first and second state selection magnet parts are coaxially supported by said metal block at either end thereof.

2. An atomic beam device as in claim 1, wherein each of the first and second state selection magnet parts comprises a pole piece unit including a pair of pole pieces hermetically assembled to form a portion of the vacuum envelope.

3. An atomic beam device of the type including a first state selection magnet part; a high frequency transition part; and a second state selection magnet part sequentially arranged along an atomic beam path in a vacuum envelope extending from an atomic beam generator to a detector, wherein the improvement comprises: said high frequency transition part comprises a rigid metal block forming a portion of the vacuum envelope, said first and second state selection magnet parts are coaxially supported at either end of said metal block, each of the first and second state selection magnet parts being comprised of a pole piece unit including a pair of pole pieces hermetically assembled to form a portion of the vacuum envelope and being hermetically attached to said metal block through a metallic cylinder, and further comprising mechanical adjusting means cooperating with each metallic cylinder for adjusting the alignment of the beam path.

4. An atomic beam device of the type including a first state selection magnet part; a high frequency transition part; and a second state selection magnet part sequentially arranged along an atomic beam path in a vacuum envelope extending from an atomic beam generator to a detector, wherein the improvement comprises: said high frequency transition part comprises a rigid metal block forming a portion of the vacuum envelope, said block comprising at least two hermetically sealed metal portions configured for forming a beam path and a high frequency waveguide communicating with the beam path, and said first and second state selection magnet parts are coaxially supported at either end of said metal block.

5. An atomic beam device as in claim 4, wherein said portions comprise two symmetrical metallic blocks joined along a plane parallel to the beam path.

6. An atomic beam device as in claim 3 or 5, further comprising yoke means for producing a magnetic field within the block, said yoke means being positioned outside of the vacuum envelope adjacent the sides of the block.

* * * * *

UNITED STATES PATENT AND TRADEMARK OFFICE
CERTIFICATE OF CORRECTION

PATENT NO. : 4,354,108

DATED : October 12, 1982

INVENTOR(S) : Toyama et al.

It is certified that error appears in the above-identified patent and that said Letters Patent is hereby corrected as shown below:

Title page, [75] Inventors,
    line 1, "Akashi" should be --Kawasaki--;
    line 3, "Kakogawa" should be --Yokohama--.

Col. 2, line 33, "absorbed" should be --absorb--.

Col. 3, line 5, "facilitates" should be --facilities--.

Col. 4, line 23, "patch" should be --path--.

Col. 6, line 47, after "path" insert --,--.

Col. 7, line 48, delete "ture";
    line 68, "visual" should be --visually--.

Signed and Sealed this

Fifth Day of April 1983

[SEAL]

Attest:

GERALD J. MOSSINGHOFF

*Attesting Officer*    *Commissioner of Patents and Trademarks*